United States Patent [19]
Kodrnja et al.

[11] Patent Number: 6,060,957
[45] Date of Patent: May 9, 2000

[54] RELAXATION OSCILLATOR WITH LOW PHASE NOISE

[75] Inventors: Marc Kodrnja; Vincent Dufossez, both of Grenoble, France

[73] Assignee: STMicroelectronics S.A., Gentilly, France

[21] Appl. No.: 09/207,236

[22] Filed: Dec. 8, 1998

[51] Int. Cl.[7] .................................................. H03B 5/24
[52] U.S. Cl. ...................... 331/143; 331/34; 331/177 R
[58] Field of Search ............................. 331/34, 111, 143, 331/177 R

[56] References Cited

U.S. PATENT DOCUMENTS

| 3,430,161 | 2/1969 | Klein ................................. 331/143 X |
| 4,292,604 | 9/1981 | Embree et al. ......................... 331/111 |
| 5,418,501 | 5/1995 | Schoofs et al. .......................... 331/11 |
| 5,508,664 | 4/1996 | Rizzo ................................... 331/111 |

OTHER PUBLICATIONS

J. Sneep et al., "Design of a Low–Noise 100–MHz Balanced Schmitt–Trigger Oscillator," ESSCIRC, 1989, Vienna, Austria, pp. 284–287.

*Primary Examiner*—David Mis
*Attorney, Agent, or Firm*—Theodore E. Galanthay; Allen, Dyer, Doppelt, Milbrath & Gilchrist, P.A.

[57] ABSTRACT

A relaxation oscillator includes a first capacitor at the terminals of which there is a first voltage $V_1$, a circuit to charge the first capacitor from a power supply voltage, a circuit to discharge the first capacitor, and a switch which alternately charges and discharges the first capacitor responsive to a control signal. The relaxation oscillator also includes a relaxation circuit to generate the oscillation signal and the control signal from the first voltage. The oscillator also includes a regulation circuit to cause the first voltage applied to the relaxation circuit to be approximately equal to a reference voltage. The circuit for charging the first capacitor includes a resistance $R_1$. The relaxation oscillator is particularly applicable to phase locked loops.

22 Claims, 3 Drawing Sheets

RELAXATION OSCILLATOR WITH LOW PHASE NOISE

FIELD OF THE INVENTION

This invention relates to an electronic circuit, and, more particularly, to a relaxation oscillator.

BACKGROUND OF THE INVENTION

Relaxation oscillators work according to the principle of charging and discharging one or several capacitors to create an oscillation phenomenon. Relaxation oscillators may be used, for example, in phase locked loops to demodulate signals or to recover carriers in telecommunication systems. One disadvantage of relaxation oscillators is that they generally have a relatively high phase noise. For example, for an operating frequency of about 100 MHz, relaxation oscillators have a phase noise of between −80 dBc/Hz and −100 dBc/Hz at 1 MHz from the carrier frequency.

A voltage controlled relaxation oscillator with a high operating frequency (typically 100 MHz) and with a relatively low phase noise (typically −118 dBc/Hz at 1 MHz from the carrier frequency) is described in an article by J. G. Sneep and D. J. M. Werhoeven entitled "Design of a low-noise 100 MHz balanced Schmitt-Trigger oscillator" (ESSCIR 1989, Vienna Austria, pp. 284–287). The block diagram for this type of voltage controlled oscillator is shown in FIG. 1. This oscillator comprises:

a first capacitor $C_1$ at the terminals of which there is a voltage $V_1$, a second capacitor $C_2$ at the terminals of which there is a voltage $V_2$, a charge circuit for capacitor $C_1$, including a current generator 4 connected to the oscillator power supply voltage $+V_{dc}$, a charge circuit for capacitor $C_2$ comprising a current generator 5 also connected to the power supply voltage $+V_{dc}$, a current generator 2, used to discharge capacitors $C_1$ and $C_2$ alternately, a switch 1, which alternately either charges capacitor $C_1$ and discharges capacitor $C_2$, or charges capacitor $C_2$ and discharges capacitor $C_1$, under the action of a control signal K, relaxation means 3, to generate the switch control signal from voltages $V_1$ and $V_2$, and regulation means 6, 7, such that voltages $V_1$ and $V_2$ applied to the relaxation means are approximately equal to a reference voltage $V_{ref}$.

The oscillator frequency is controlled by a control signals CD for respective currents in current generators 4 and 5. Current generators 4 and 5 comprise transistors, of which the parasitic capacitances are sensitive to any variations in the power supply voltage $+V_{dc}$. To avoid possible disturbances as a result of the sensitivity, expensive and large filter devices, such as, first order low pass filters requiring the use of large components, then have to be placed between the power supply and current generators.

Furthermore, one possible way of improving oscillator phase noise performance, if required, is to place decay resistances on emitters of the transistors used in the current generators. The effect of decay resistances being present is to increase the potential drop at the terminals of the current generators. The result is a reduction in the voltage range available for operation of the oscillator.

Regulation means comprise a circuit 6 that takes the average of voltages $V_1$ and $V_2$ and a comparator 7 that receives the average of voltages $V_1$ and $V_2$ on a first input, and a reference voltage $V_{ref}$ on a second input. The signal output from comparator 7 is applied to control current generator 2.

The oscillation frequency depends on the value of the current output from the current generator 2. It follows that the regulation circuit acts directly on the oscillation frequency of the oscillator. The noise from the various components that make up the regulation loop then directly affects the oscillator phase noise.

SUMMARY OF THE INVENTION

In view of the foregoing background, it is therefore an object of the invention to provide a relaxation oscillator which overcomes the drawbacks of the prior art. The invention relates to a relaxation oscillator comprising:

a capacitor at the terminals of which there is a voltage $V_1$, a circuit that charges the capacitor from a power supply voltage $+V_{dc}$, a circuit that discharges the capacitor, a switch that alternately charges and discharges the capacitor under the action of a control signal, relaxation means for generating the switch control signal from voltage $V_1$, and regulation means, such that the voltage $V_1$ applied to the relaxation means is approximately equal to a reference voltage $V_{ref}$.

The charge circuit for capacitor $C_1$ is a resistance. One advantage of the invention is that the charging circuit used to charge capacitor $C_1$ is not a current generator.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 2:
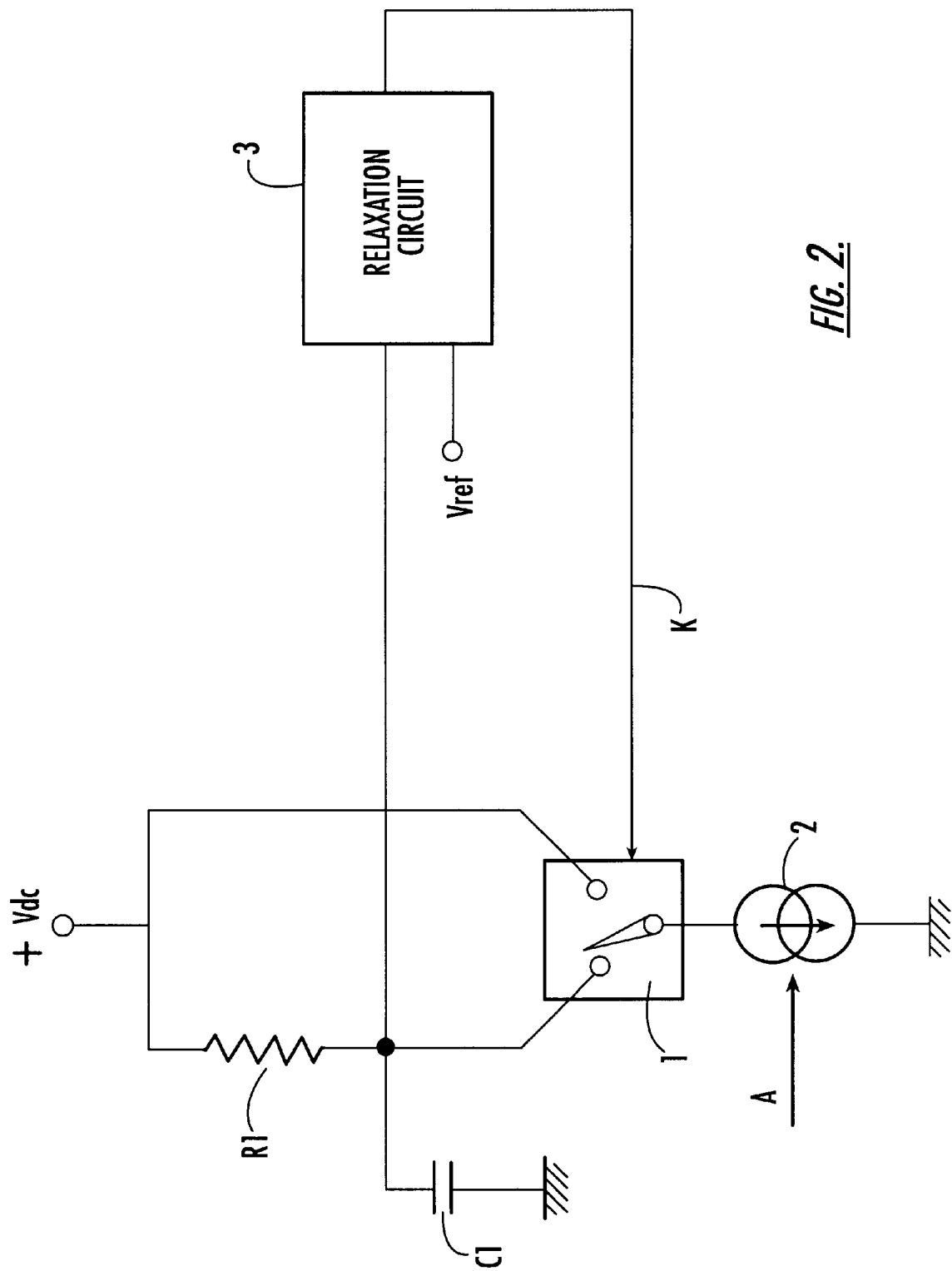
FIG. 2 shows a relaxation oscillator according to a first embodiment of the invention.

The same references denote the same elements in all the figures. FIG. 2 shows a relaxation oscillator according to a first embodiment of the invention. The oscillator in FIG. 2 comprises a capacitor $C_1$, a resistance $R_1$, a switch 1, a current generator 2 and relaxation means 3. According to the embodiment shown in FIG. 2, the relaxation means are coincident with the regulation means.

The first terminal of resistance $R_1$ is connected to the power supply voltage $+V_{dc}$, and the second terminal is connected to the first terminal of capacitor $C_1$. The second terminal of capacitor $C_1$ is connected to ground. The first terminal of switch 1 is connected to the current generator 2, the second terminal is connected to the first terminal of capacitor $C_1$, and the third terminal is connected to the $+V_{dc}$ power supply voltage.

Relaxation means 3 comprise a comparator (not shown in the figure) that receives the voltage $V_1$ from the terminals of capacitor $C_1$ on the first input, and the reference voltage $V_{ref}$ on the second input. Relaxation means 3 create a control signal K applied to switch 1, in a manner known by those skilled in the art. Under the action of the control signal K, the switch alternately connects the first terminal of capacitor $C_1$ or the $+V_{dc}$ power supply voltage, to the current generator 2.

According to the invention, it is possible that the value of the resistance $R_1$ is relatively high. For example, the resistance $R_1$ for an oscillator operating at a frequency on the order of 80 MHz may be equal to several kOhms. This resistance may advantageously have excellent performances in terms of current noise. It is then possible to work with relatively low $+V_{dc}$ power supply voltages while maintaining excellent noise performance. All other things being equal, the invention then makes it possible to work with lower power supply voltages than would be possible according to prior art, for example +4.5 volts instead of 6 volts.

If the oscillation frequency is adjusted using a control signal, this control signal (reference A in FIG. 2) is applied to the current generator 2 to modulate its current. The various elements used to directly adjust the value of the oscillation frequency are the capacitor $C_1$, the resistance $R_1$ and the value of the current that passes through the current generator 2. Advantageously, the regulation circuit according to the invention is independent of the various elements that act on the oscillation frequency.

Figure 3:
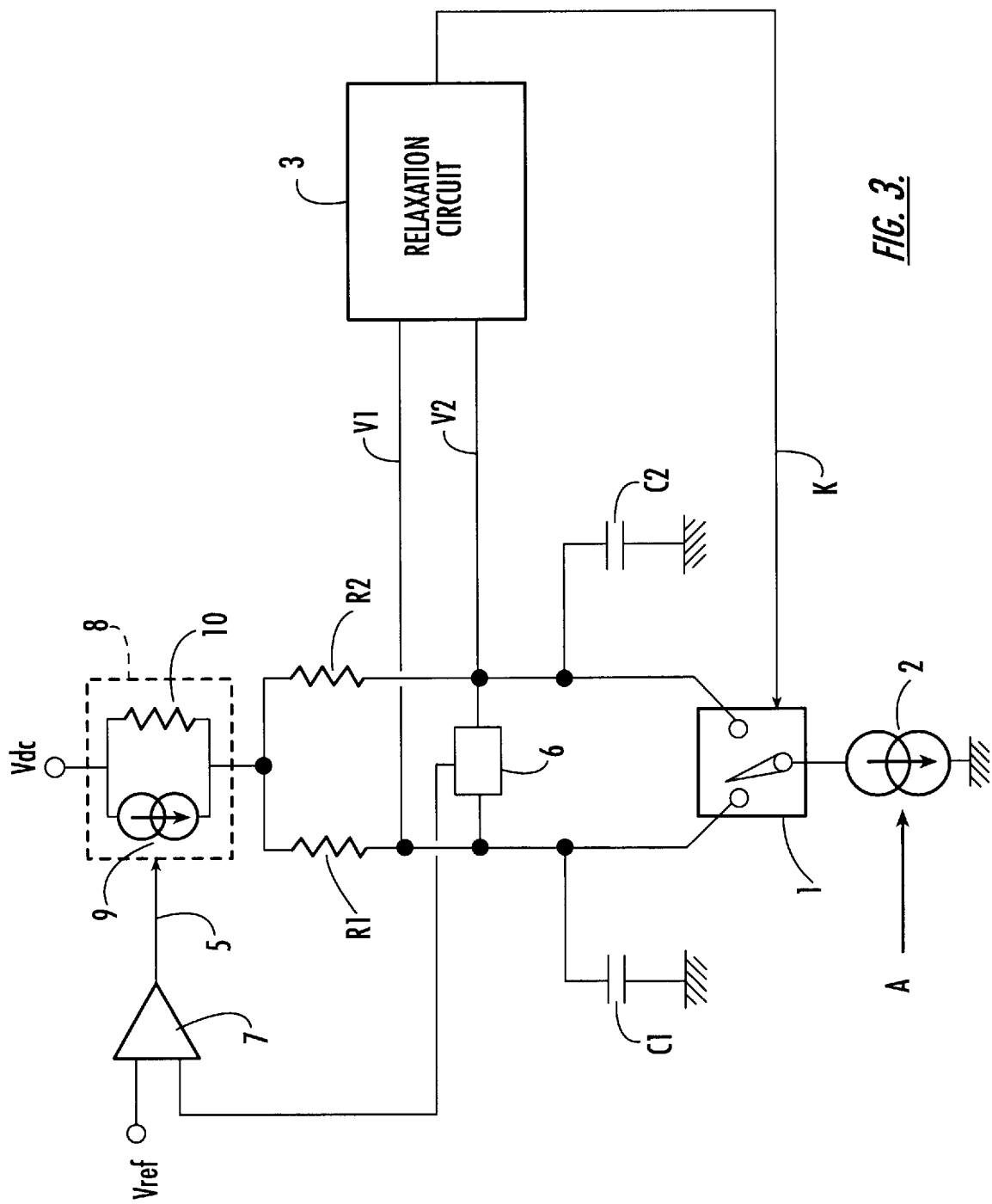
FIG. 3 shows a relaxation oscillator according to a second embodiment of the invention.

FIG. 3 shows an oscillator according to a second embodiment of the invention. In addition to the elements mentioned above, the oscillator according to FIG. 3 comprises a second capacitor $C_2$, a second resistance $R_2$, a circuit 6 that takes the average of the voltages at its terminals, a comparator 7 and a subassembly 8 comprising a current generator 9 in parallel with a resistance 8. For example, circuit 6 may be made using resistances.

The assembly comprising circuit 6, comparator 7 and sub-assembly 8 form the regulation means according to the second embodiment of the invention. The subassembly 8 comprises a first terminal connected to the $+V_{dC}$ power supply voltage and a second terminal connected to first terminal of resistance $R_1$ and a first terminal of resistance $R_2$. The second terminal of resistance $R_2$ is connected to a first terminal of capacitor $C_2$, the second terminal of which is connected to the ground. The first terminal of capacitor $C_2$ is connected to the third terminal of switch 1. The resistance $R_1$, the capacitor $C_1$, switch 1 and the current generator 2 are connected together as shown in FIG. 2.

Circuit 6, which is used to determine the average of the voltages at its terminals, has a first terminal connected to the first terminal of capacitor $C_1$ and a second terminal connected to the first terminal of capacitor $C_2$. The mid-point of circuit 6, from which the average of the voltages is extracted, is connected to a first input of a comparator 7. The second input of the comparator 7 is connected to the reference voltage $V_{ref}$. The signal S output from comparator 7 is applied as a current control signal for current generator 9.

Figure 1:
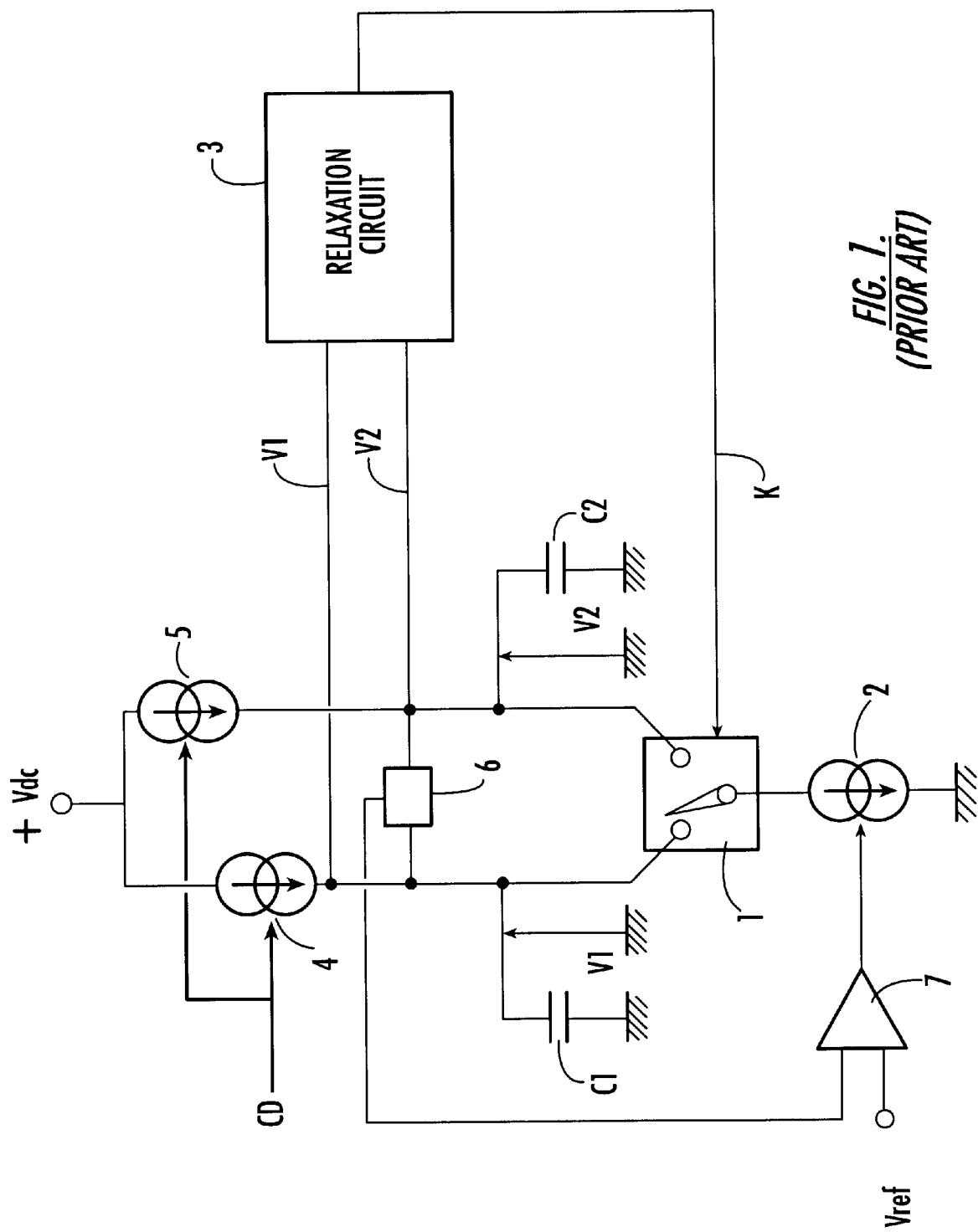
FIG. 1 shows a voltage controlled relaxation oscillator according to prior art.

Advantageously, capacitors $C_1$ and $C_2$ are charged through resistances $R_1$ and $R_2$, respectively. It is then possible to improve rejection of the power supply voltage, all other things being equal, compared with a device according to prior art such as that shown in FIG. 1. It is also possible to achieve low phase noise, for example, –120 dBc/Hz at 1 MHz from the carrier frequency for an operating frequency approximately equal to 80 MHZ. This can be achieved with lower power supply voltages, for example, 4.5 volts instead of 6 volts, for a device according to prior art as shown in FIG. 1.

Preferably, the resistance $R_1$ has the same value as resistance $R_2$, and capacitor $C_1$ has the same value as capacitor $C_2$. If the oscillation frequency is adjustable using a control signal A, this control signal is applied to current generator 2 to modulate the current passing through it. Advantageously, the regulation circuit according to the invention is independent of the various elements (capacitors $C_1$ and $C_2$, resistances $R_1$ and $R_2$, and the value of the current that passes through the current generator 2) which are used to define the oscillation frequency.

Due to its excellent phase noise performance, the invention is particularly beneficial for making phase locking loops used for demodulation. For example, the demodulation may include synchronous amplitude demodulation (intermediate frequency circuit for television), frequency demodulation, and demodulation of digital transmissions as part of quadrature amplitude modulation (QAM) or phase shift keying (PSK).

That which is claimed is:

1. A relaxation oscillator for generating an oscillation signal and comprising:
    a first capacitor having a first voltage at terminals thereof;
    a first charging circuit for charging the first capacitor from a power supply voltage and comprising at least one first resistor;
    a first discharging circuit for discharging the first capacitor;
    a relaxation circuit for generating from the first voltage the oscillation signal and a control signal, the control signal having a frequency approximately equal to the oscillation signal;
    a switch for alternately charging and discharging the first capacitor responsive to the control signal; and
    a regulation circuit for causing the first voltage applied to the relaxation circuit to be approximately equal to a reference voltage.

2. A relaxation oscillator according to claim 1, wherein the regulation circuit comprise a comparator for comparing the first voltage with the reference voltage.

3. A relaxation oscillator according to claim 1, further comprising:
    a second capacitor having a second voltage at terminals thereof; and
    a second charging circuit for charging the second capacitor from the power supply voltage and comprising at least one second resistor.

4. A relaxation oscillator according to claim 3, wherein the first discharging circuit is also used to discharge the second capacitor; and wherein the switch is used to control either charging the first capacitor and discharging the second capacitor or charging the second capacitor and discharging the first capacitor.

5. A relaxation oscillator according to claim 4, wherein the regulation circuit causes the first and second voltages to be approximately equal to the reference voltage.

6. A relaxation oscillator according to claim 5, wherein the regulation circuit further comprises:
    a circuit determining an average of the first and second voltages;
    a comparator to which the average of the first and second voltages and the reference voltage are applied; and
    a circuit comprising at least one third resistor and a first current generator connected in parallel between the power supply voltage and a node common to the at least one first and second resistors, the first current generator being controlled by a signal output from the comparator.

7. A relaxation oscillator according to claim 1, wherein the first discharge circuit comprises a second current generator.

8. A relaxation oscillator according to claim 3, wherein the first and second capacitors are approximately equal, and the at least one first and second resistors are approximately equal.

9. A relaxation oscillator according to claim 7, wherein the second current generator has an input for receiving a signal for controlling modulation to match to a frequency of the relaxation oscillator.

10. A phase-locked loop comprising:
   a circuit for generating a frequency control signal; and
   a relaxation oscillator for generating an oscillation signal responsive to the frequency control signal, said relaxation oscillator comprising
      a first capacitor having a first voltage at terminals thereof,
      a first charging circuit for charging the first capacitor from a power supply voltage and comprising at least one first resistor,
      a first discharging circuit for discharging the first capacitor,
      a relaxation circuit for generating from the first voltage the oscillation signal and a control signal, the control signal having a frequency approximately equal to the oscillation signal,
      a switch for alternately charging and discharging the first capacitor responsive to the control signal, and
      a regulation circuit for causing the first voltage applied to the relaxation circuit to be approximately equal to a reference voltage.

11. A phase-locked loop according to claim 10, wherein the regulation circuit comprise a comparator for comparing the first voltage with the reference voltage.

12. A phase-locked loop according to claim 10, further comprising:
   a second capacitor having a second voltage at terminals thereof; and
   a second charging circuit for charging the second capacitor from the power supply voltage and comprising at least one second resistor.

13. A phase-locked loop according to claim 12, wherein the first discharging circuit is also used to discharge the second capacitor; and wherein the switch is used to control either charging the first capacitor and discharging the second capacitor or charging the second capacitor and discharging the first capacitor.

14. A phase-locked loop according to claim 13, wherein the regulation circuit causes the first and second voltages to be approximately equal to the reference voltage.

15. A phase-locked loop according to claim 14, wherein the regulation circuit further comprises:
   a circuit determining an average of the first and second voltages;
   a comparator to which the average of the first and second voltages and the reference voltage are applied; and
   a circuit comprising at least one third resistor and a first current generator connected in parallel between the power supply voltage and a node common to the at least one first and second resistors, the first current generator being controlled by a signal output from the comparator.

16. A phase-locked loop according to claim 10, wherein the first discharge circuit comprises a second current generator.

17. A phase-locked loop according to claim 12, wherein the first and second capacitors are approximately equal, and the at least one first and second resistors are approximately equal.

18. A phase-locked loop according to claim 17, wherein the second current generator has an input for receiving the frequency control signal.

19. A method for generating an oscillation signal comprising the steps of:
   Applying a first voltage to a first capacitor;
   using a relaxation circuit to generate from the first voltage an oscillation signal and a control signal, the control signal having a frequency approximately equal to the oscillation signal;
   alternately charging and discharging the first capacitor responsive to the control signal, the step of charging comprising charging the first capacitor from a power supply voltage through at least one first resistor; and
   causing the first voltage applied to the relaxation circuit to be approximately equal to a reference voltage.

20. A method according to claim 19, wherein the step of causing comprises comparing the first voltage with the reference voltage.

21. A method according to claim 19, further comprising the steps of:
   applying a second voltage to a second capacitor; and
   charging the second capacitor from the power supply voltage through at least one second resistor.

22. A method according to claim 21, further comprising the step of causing the first and second voltages to be approximately equal to the reference voltage.

* * * * *